United States Patent [19]

Kuriyama

[11] Patent Number: 5,592,082
[45] Date of Patent: Jan. 7, 1997

[54] MAGNETIC SENSOR WITH PERMANENT MAGNET BIAS LAYERS

[75] Inventor: Toshihiro Kuriyama, Niigata-ken, Japan

[73] Assignee: Alps Electric Co., Ltd., Tokyo, Japan

[21] Appl. No.: 525,874

[22] Filed: Sep. 8, 1995

[30] Foreign Application Priority Data

Sep. 29, 1994 [JP] Japan .................................. 6-259379

[51] Int. Cl.$^6$ .............................. G11B 5/39; G01R 33/09
[52] U.S. Cl. ......................... 324/252; 338/32 R; 360/113
[58] Field of Search ............................. 324/207.21, 252; 338/32 R; 360/113; 29/603

[56] References Cited

U.S. PATENT DOCUMENTS

| | | | |
|---|---|---|---|
| 3,256,483 | 6/1966 | Broadbent | 360/113 X |
| 3,840,898 | 10/1974 | Bajorek et al. | 360/113 |
| 4,425,593 | 1/1984 | Postma | 360/113 |
| 5,260,652 | 11/1993 | Collver et al. | 324/252 |
| 5,420,736 | 5/1995 | Heim et al. | 360/113 |
| 5,428,491 | 6/1995 | Smith | 360/113 |
| 5,485,334 | 1/1996 | Nix et al. | 360/113 |

*Primary Examiner*—Gerard R. Strecker
*Attorney, Agent, or Firm*—Guy W. Shoup; Patrick T. Bever

[57] ABSTRACT

A magnetic sensor includes a magnetoresistive effect layer (MR layer), on which permanent magnet layers are superimposed, the permanent magnet layers having slanted edges forming an angle $\phi$ with respect to the direction of an electric current I. The electrical resistance of the permanent magnet layers is higher than that of the MR layer. Due to the N and S polarities of the opposing slanted edges, sections of the MR layer located between the opposing slanted edges are magnetized with the angle $\phi$ such that a single magnetic domain is formed. The direction of magnetization M is at an angle $\phi$ of approximately 45° with respect to the electric current I, so that it is possible to detect a change in the electrical resistance of the MR layer whenever there is a change in the external magnetic field H. Since the sections of the MR layer located between the opposing slanted edges are effected by the single magnetic domain in a direction having the angle $\phi$ relative to the direction of the applied current, a reduction in Barkhausen noise can be achieved.

9 Claims, 3 Drawing Sheets

MAGNETIC SENSOR WITH PERMANENT MAGNET BIAS LAYERS

BACKGROUND OF THE INVENTION

The present invention relates to a magnetic sensor for detecting leakage magnetic fields from recording media, etc. by utilizing the magnetoresistive effect (MR effect), and, in particular, to a magnetic sensor which diminishes Barkhausen noise to make it possible to perform magnetic detection with high accuracy.

DESCRIPTION OF THE RELATED ART

FIGS. 5A and 5B are diagrams illustrating the magnetoresistive effect. Numeral 1 indicates a magnetoresistive effect layer (MR layer).

The MR (magnetoresistive effect) layer 1 is formed of a conductive magnetic material, such as permalloy (an Fe-Ni-type alloy).

Symbol I indicates an electric current supplied to the MR layer 1; symbol H indicates an external magnetic field, such as a leakage magnetic field from a recording medium, consisting of a magnetic disk, a magnetic tape or the like; and symbol M indicates a magnetization of the MR layer 1. Assuming that the angle formed by the direction of magnetization M of the MR layer 1 and the direction of the electric current I is $\phi$, the electrical resistance R of the MR layer 1 can be given by equation 1:

$$R = R0 + \Delta R \cdot \cos^2 \phi$$

In the above equation, R0 represents the basic electrical resistance value of the MR layer 1. In equation 1, when $\phi=0°$, $R=R0+\Delta R$, and when $\phi=90°$, $R=R0$.

In FIG. 5B, the horizontal axis indicates the strength of the external magnetic field H, and the vertical axis indicates the electrical resistance R mentioned above. When an external magnetic field H is applied to the MR layer 1, and the angle $\phi$ of the magnetization M varies by $\pm\Delta\phi$, the electrical resistance R varies. By detecting this variation in the electrical resistance R as a voltage, it is possible to detect a change in the strength of the external magnetic field H. However, to detect a change in the external magnetic field H with linearity as a change in the electrical resistance R, it is necessary to set the angle $\phi$, which is formed by the direction of magnetization M of the MR layer 1 and the direction of the electric current I, at around 45° beforehand. FIG. 5B shows how the electric current R varies with respect to a variation in the external magnetic field H when the angle $\phi$ is around 45°.

For example, in the case of a magnetic sensor provided on a flying type magnetic head for use in hard disk apparatuses, the MR layer 1 is turned into a single magnetic domain in the same direction as that of the electric current by a hard bias method or an exchange bias method using permanent magnets. Further, by supplying an SAL bias, the direction of magnetization M of the MR layer 1 is changed so as to set the angle $\phi$ at approximately 45°.

The above-mentioned hard bias method is suitable for use in a hard disk, which has a small track width. However, the method has a problem in that the formation of the component layers is rather difficult, resulting in high production costs.

FIG. 4 shows an example of a known magnetic sensor utilizing the magnetoresistive effect. This is called a "Barber pole system", and is used in a magnetic head for magnetic tapes having a relatively large track width, such as DCC.

In the magnetic sensor shown in FIG. 4, a plurality of non-magnetic conductive layers 2a, 2b, 2c and 2d are superimposed on an MR layer 1 that is formed of permalloy or the like. These non-magnetic conductive layers 2a, 2b, 2c and 2d are formed of a metal material whose specific resistance $\rho$ is low, such as gold (Au), copper (Cu), aluminum (Al) or an alloy of these metals. Slanted edges 3a and 3b, which are arranged parallel and opposed to each other on the MR layer 1, are formed on the non-magnetic conductive layers that are adjacent to each other. The angle $\phi$ formed by the slanted edges 3a and 3b and the direction of magnetization M of the MR layer 1 is set at around 45°.

An electric current I is supplied, for example, to the leftmost non-magnetic conductive layer 2a, the electric current I being passed through the MR layer 1. The electric current I flows through the MR layer 1 as it is attracted by the non-magnetic conductive layers 2b, 2c and 2d, having a low specific resistance, and comes out from the rightmost non-magnetic conductive layer 2d. The slanted edges 3a and 3b of the non-magnetic conductive layers, having a small specific resistance, are arranged parallel and opposed to each other on the MR layer 1 at the angle $\phi$. Therefore, in those sections A, B and C of the MR layer which are between the non-magnetic conductive layers, the electric current I will flow in the shortest distance between the slanted edges 3a and 3b, with the result that, in the sections A, B and C, the direction of the electric current I flowing through the MR layer 1 is at an angle substantially equal to $\phi$ with respect to the direction of magnetization M. Thus, as shown in FIG. 5B, a change in the strength of the external magnetic field H results in a change in the electrical resistance R, which has a linearity.

However, the magnetic sensor of the Barber pole type shown in FIG. 4 has the following problems:

(1) Metal layers of Au, Cu, Al or the like are superimposed on an MR layer 1, which is formed of permalloy or the like, to form non-magnetic conductive layers 2a, 2b, 2c and 2d. When these metal layers are formed on the surface of the MR layer 1, an oxide film is liable to be formed in the interface between the layers due to the heat generated during film formation. This oxide film causes an increase in the contact resistance between the MR layer 1 and the non-magnetic conductive layers. As a result, in the sections indicated by the symbols A, B and C, the electric current flowing through the MR layer 1 ceases to be directed perpendicular to the slanted edges 3a and 3b of the non-magnetic conductive layers 2b, 2c, ..., thereby making it impossible to accurately set the angle $\phi$, which is formed by the direction of magnetization M and the direction of the electric current I. Thus, the linearity of the magnetic detection output as shown in FIG. 5B cannot be maintained, resulting in a deterioration in detection accuracy.

(2) The direction of magnetization M of the MR layer 1 is set to be in the right-hand direction as indicated by the arrow in FIG. 4. However, when no bias magnetic field is applied to the MR layer 1 from an outside source, the MR layer 1 has a multi-magnetic-domain structure, so that Barkhausen noise is generated, resulting in a deterioration in detection accuracy. To effect a single-magnetic-domain formation in the M-direction in the MR layer 1, it is necessary to supply a bias magnetic field to the MR layer 1 from an outside source. Provision of a layer for supplying this bias magnetic field results in the structure of the magnetic sensor becoming complicated, thereby making the film formation difficult. Further, the Barber-pole-type magnetic sensor generally has a large track width Tw, so that it is practically impossible to turn the MR layer 1 into a single magnetic domain over the entire Tw with high accuracy by a bias magnetic field applied from an outside source.

SUMMARY OF THE INVENTION

The present invention has been made with a view toward solving the above problems in the prior art. It is an object of this invention to provide a magnetic sensor that is capable of detecting external magnetic fields with high accuracy and of reducing Barkhausen noise.

In accordance with the present invention, there is provided a magnetic sensor comprising: a magnetoresistive effect layer to which an electric current is supplied; and a plurality of permanent magnet layers superimposed on the magnetoresistive effect layer to supply a bias magnetic field thereto, wherein the permanent magnet layers have slanted edges that are slanted with respect to the direction of the electric current and to the direction of an external magnetic field, with slanted edges of different magnetic polarities being opposed to each other on the magnetoresistive effect layer.

In the above-described magnetic sensor, the electrical resistance of the permanent magnet layers is set to be higher than the electrical resistance of the magnetoresistive effect layer.

Those permanent magnet layers which are superimposed on the end sections of the magnetoresistive effect layer may also serve as lead layers for supplying electric current to the magnetoresistive effect layer.

In the above-described magnetic means, the magnetoresistive effect layer (MR layer) is formed of a conductive magnetic material, such as permalloy (an Fe-Ni-type alloy). A plurality of magnetic substance layers are formed on this MR layer, and these magnetic substance layers consist of permanent magnet layers having a residual magnetization. Slanted edges that are slanted with respect to the direction of an electric current supplied to the MR layer and to the direction of an external magnetic field, such as a leakage field from a magnetic disk or a magnetic tape, are formed on the permanent magnet layers such that slanted edges of different magnetic polarities are parallel and opposed to each other on the MR layer. Thus, each of those sections of the MR layer which are between the slanted edges of the permanent magnet layers is turned into a single magnetic domain in a direction perpendicular to the opposed slanted edges, whereby an angle $\phi$ of approximately 45° is set between the direction of the electric current I and the direction of magnetization M.

When an external magnetic field H is supplied to the MR layer, the direction of magnetization M varies by $\pm\Delta\phi$ with respect to the angle $\phi$. As a result, as shown in FIG. 5B, a variation in the electrical resistance R of the MR layer relative to a variation in the external magnetic field H exhibits a linearity. By detecting a change in voltage corresponding to this change in the electrical resistance R, it is possible to detect a change in the external magnetic field H.

In accordance with the magnetic sensor of the present invention, in the sections between the slanted edges of the permanent magnet layers, the MR layer is turned into a single magnetic domain in the direction of the angle $\phi$ with high accuracy due to the magnetic polarities of the slanted edges. Thus, the Barkhausen noise at the detection voltage can be reduced, thereby making it possible to detect magnetic fields with high accuracy.

The magnetic substance layers, serving as the permanent magnet layers, are formed, for example, of a Co-Pt (cobalt-platinum) based alloy, or a Co-Cr-Ta (cobalt-chromium-tantalum) based alloy. The Co-Pt based alloy and Co-Cr-Ta based alloy are conductive magnetic materials. Therefore, to fix the direction of the electric current flowing through the MR layer in a direction perpendicular, for example, to the external magnetic field, it is desirable for the electrical resistance of the permanent magnet layers to be set higher than the electrical resistance of the MR layer. For this purpose, it is desirable for the setting to be made such that the following relationship holds true: $(\rho1/t1)<(\rho2/t2)$, where $\rho1$ represents the specific resistance of the MR layer, $t1$ represents the thickness of the MR layer, $\rho2$ represents the specific resistance of the permanent magnet layers, and $t2$ represents the thickness of the permanent magnet layers.

By making the electrical resistance of the permanent magnet layers higher than that of the MR layer, it is possible to prevent electric current from flowing in a direction perpendicular to the slanted edges of the permanent magnet layers, so that the electric current flows linearly through the MR layer.

By setting the electrical resistance of the permanent magnet layers to be higher than that of the MR layer, it is possible, as described above, to linearly fix the direction of electric current in the MR layer. Therefore, those permanent magnet layers which are superimposed on the end sections of the MR layer can also serve as lead layers for supplying electric current to the MR layer.

In the prior-art example, poor performance is created by an increase in contact resistance due to the oxide in the interface between the MR layer and the non-magnetic conductive layers. In the present invention, in contrast, it is desirable for this contact resistance to be high so that the electric current flowing through the MR layer may not be attracted toward the slanted edges of the permanent magnet layers. Thus, the present invention is less restricted in terms of film formation conditions when compared to the prior-art example, thereby facilitating production of the magnetic sensor.

It is also possible for the permanent magnet layers to be formed of a non-conductive magnetic material. In this case, the permanent magnet layers cannot serve as lead layers. Thus, lead layers (electrode layers) separate from the permanent magnet layers are formed, and an electric current is supplied to the MR layer through these lead layers.

BRIEF DESCRIPTION OF THE DRAWINGS

FIGS. 5A and 5B are diagrams illustrating the magnetoresistive effect, of which FIG. 5A is a plan view of a magnetoresistive effect layer and FIG. 5B is a chart showing how electrical resistance varies with respect to external magnetic field.

DESCRIPTION OF THE PREFERRED EMBODIMENTS

Embodiments of the present invention will now be described.

Figure 1:
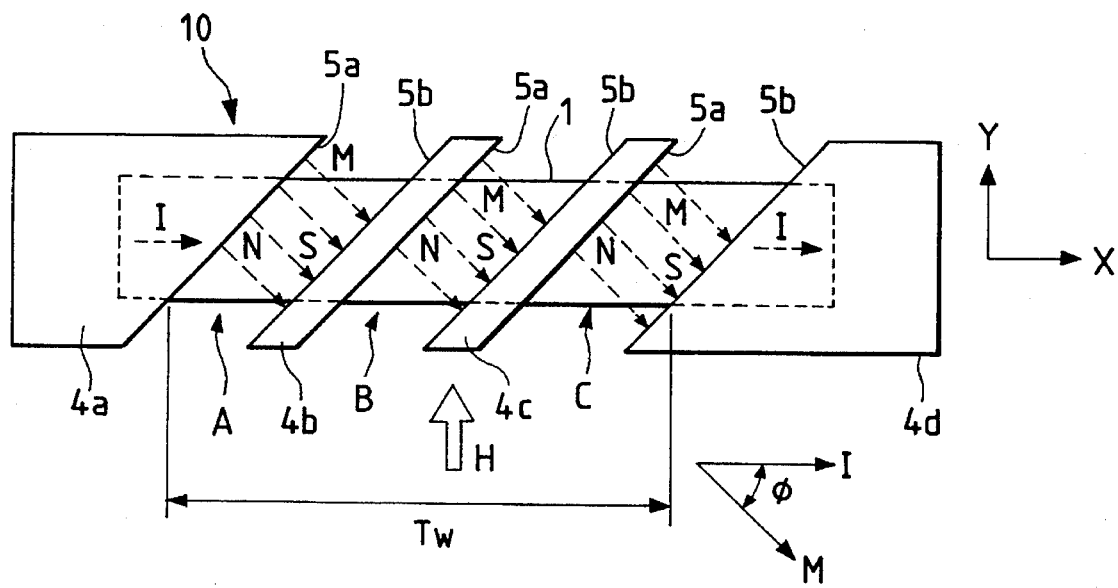
FIG. 1 is a plan view showing a magnetic sensor according to an embodiment of the present invention.

FIG. 1 is a plan view of a magnetic sensor 10 according to an embodiment of the present invention.

This magnetic sensor 10 includes a magnetoresistive effect layer (MR layer) 1 formed of a permalloy (an Fe-Ni type alloy) and having a rectangular configuration when seen in plan view. A plurality of permanent magnet layers 4a, 4b, 4c and 4d are formed on this magnetoresistive effect layer 1. When this magnetic sensor 10 is used as a magnetic head or the like, an electrically insulating layer of $Al_2O_3$ or the like is formed on a shielding layer of permalloy or the like, and the MR layer 1 and the permanent magnet layers 4a, 4b, 4c and 4d are stacked thereon. Further, an electrically insulating layer of $Al_2O_3$ or the like is formed on top of that. Still further, a magnetic shield layer is formed thereon.

In the embodiment of FIG. 1, the material of the permanent magnet layers is a conductive magnetic material which is obtained through magnetization of a Co-Pt based alloy, a Co-Cr-Ta based alloy or the like.

An electric current I flows through the MR layer 1 linearly in the X-direction. The external magnetic field, consisting, for example, of a leakage magnetic flux from a magnetic disk or a magnetic tape, is applied in the Y-direction.

Slanted edges 5a and 5b, which are parallel (or approximately parallel) and opposed to each other, are formed on those sides of the permanent magnet layers 4a, 4b, 4c and 4d which are adjacent to each other. The slanted edges 5a and 5b are slanted with respect to both the direction of the electric current (the X-direction) and the direction of the external magnetic field H (the Y-direction). The angle of inclination φ of the slanted edges 5a and 5b with respect to the X-direction is around 45°. The direction of the residual magnetization of the permanent magnet layers 4a through 4d is the X-direction or a direction slanted by the angle φ with respect to the X-direction (the same direction as M in FIG. 1). The polarities of the slanted edges 5a and 5b differ from each other. For example, when the polarity of the slanted edges 5a is N, that of the slanted edges 5b is S.

The electrical resistance of the permanent magnet layers 4a through 4d, which are formed of a conductive material, are set to be higher than the electrical resistance of the MR layer 1. The electrical resistance r of the conductive material can be given by the following equation (2):

$$r = \rho \cdot \frac{l}{t \cdot w}$$

In the above equation, ρ indicates specific resistance, t indicates film thickness, w indicates width, and l indicates length. When the MR layer 1 is formed of permalloy, its specific resistance ρ1 is approximately 25 (μΩ·cm), and when the permanent magnet layers 4a through 4d are formed of a Co-Pt based alloy, Co-Cr-Ta based alloy or the like, its specific resistance ρ2 is approximately 90 (μΩ·cm). In this embodiment, the specific resistance ρ2 of the permanent magnet layers is three times or more as large as the specific resistance ρ1 of the MR layer 1.

In the magnetic sensor 10 shown in FIG. 1, the electrical resistance of the permanent magnet layers 4a through 4d is set to be higher than the electrical resistance of the MR layer 1, whereby the electric current I flowing through the MR layer 1 is prevented from being short-circuited between the slanted edges 5a and 5b, the direction of the electric current I is prevented from being inclined with respect to the X-direction. Further, it is also possible to adopt a structure in which those permanent magnet layers 4a and 4d which are at the ends of the MR layer can also serve as lead layers (electrode layers). In that case, it is possible to supply electric current I to the MR layer 1 from the permanent magnet layer 4a and to extract it from the permanent magnet layer 4d. Further, by setting the electrical resistance of the permanent magnet layers to be relatively high, as stated above, it is possible to prevent short-circuiting of electric current in the M-direction between the slanted edges 5a and 5b.

As indicated by equation (2), the electrical resistance r is proportional to the length (l) and inversely proportional to the cross-sectional area (t·w). In FIG. 1, the permanent magnet layers 4b and 4c have the shortest length in the X-direction. Thus, the above effect can be obtained when the electrical resistance of these permanent magnet layers 4b and 4c is higher than the electrical resistance of those sections of the MR layer 1 which are indicated by the symbols A, B and C.

When the magnetic sensor 10 is a thin-film type, there is only a small difference in width (w) and length (l) between those portions of the MR layer 1 indicated by the symbols A, B and C and the permanent magnet layers 4b and 4c. Therefore, when (ρ1/t1)<(ρ2/t2) (where t1=the thickness of the MR layer 1; t2=the thickness of the permanent magnet layers 4a through 4d), it is possible for the electrical resistance of the permanent magnet layers 4b and 4c to be made higher than the electrical resistance of the sections A, B and C of the MR layer 1.

Next, the operation of the magnetic sensor 10 shown in FIG. 1 will be described.

The slanted edges 5a and 5b of adjacent permanent magnet layers are arranged on the MR layer 1 so as to be parallel and opposed to each other, with the slanted edges 5a and 5b being slanted by the angle φ with respect to the direction of the electric current (the X-direction). Of the opposed slanted edges, the polarity of the slanted edges 5a is N and that of the slanted edges 5b is S. Thus, as indicated by the dotted line of FIG. 1, in the sections A, B and C of the MR layer 1, which are between the permanent magnet layers, the direction of the angle φ with respect to the direction of the electric current I (the X-direction) is the direction of magnetization M, so that the sections A, B and C of the MR layer 1 are turned into a single magnetic domain in the direction M.

In this embodiment, the permanent magnet layers 4a and 4d that are situated at the ends of the MR layer also serve as lead layers, and the electric current I is supplied to the MR layer 1 from the permanent magnet layer 4a. As described above, the electrical resistance of the permanent magnet layers 4b and 4c is higher than the electrical resistance of the sections A, B and C of the MR layer 1, so that, in the MR layer 1, the electric current I flows in the X-direction.

Figure 5A:
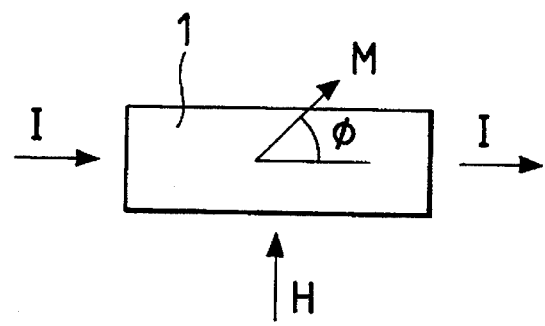
Figure 5B:
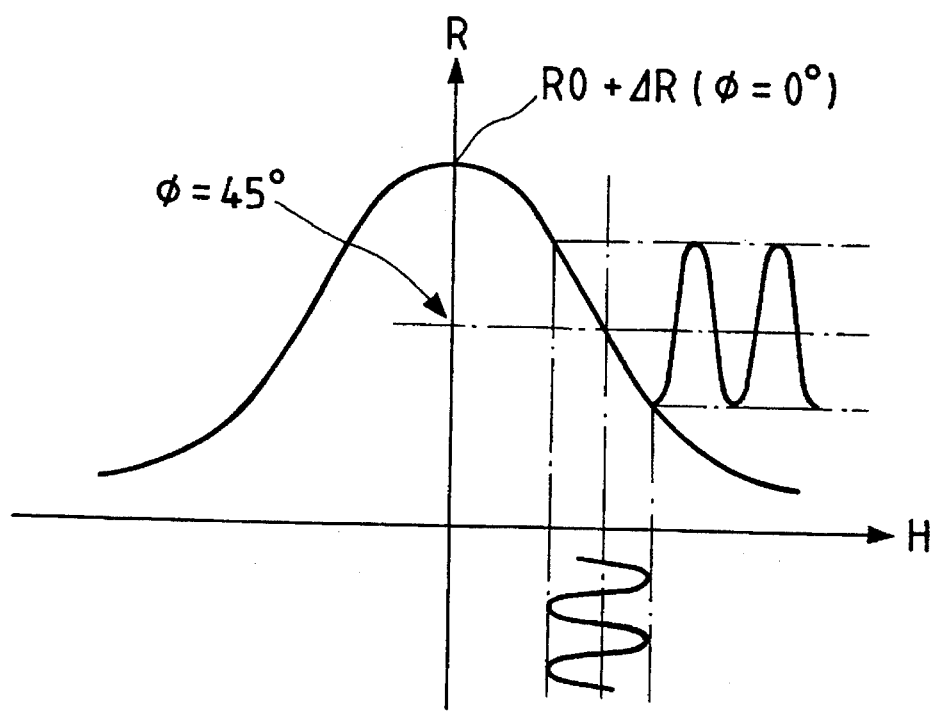

Thus, in the sections A, B and C of the MR layer 1, the direction of magnetization M for single magnetic-domain formation has an angle φ that is around 45° with respect to the direction of the electric current I. Therefore, the angle φ of magnetization M varies with respect to the strength of the external magnetic field H, which consists, for example, of a leakage magnetic field from a recording medium, such as a magnetic disk or a magnetic tape. As shown in FIG. 5B, the resistance R of the MR layer 1 varies with linearity with respect to a variation in the magnetic field H. By detecting the variation in voltage at this time, it is possible to detect the magnetic field H.

The number of intermediately positioned permanent magnet layers 4b and 4c is chosen in accordance with the track width Tw of the magnetic sensor 10. To effect single-magnetic-domain formation in the direction M in the sections A, B and C of the MR layer 1, it is necessary for the interval between the slanted edges 5a and 5b to be made small to some degree. Thus, when the track width Tw is large, the number of intermediate permanent magnet layers is large.

Figure 2:
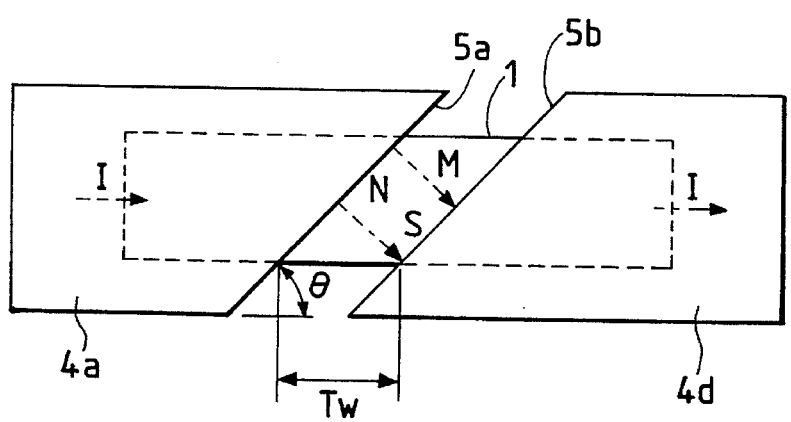
FIG. 2 is a plan view showing a magnetic sensor according to another embodiment of the present invention.

When the track width Tw is small, only two permanent magnet layers, 4a and 4d, are provided, as shown in FIG. 2, and the slanted edges 5a and 5b, formed on the permanent magnet layers 4a and 4d, respectively, are arranged parallel to each other at an angle θ.

Further, it is also possible for the permanent magnet layers 4a through 4d shown in FIG. 1 or the permanent magnet layers 4a and 4d to be formed of a non-conductive magnetic material. In this case, the permanent magnet layers 4a and 4d cannot serve as lead layers, so that lead layers (electrode layers) connected to the right and left ends of the MR layer 1 are separately formed.

Figure 3:
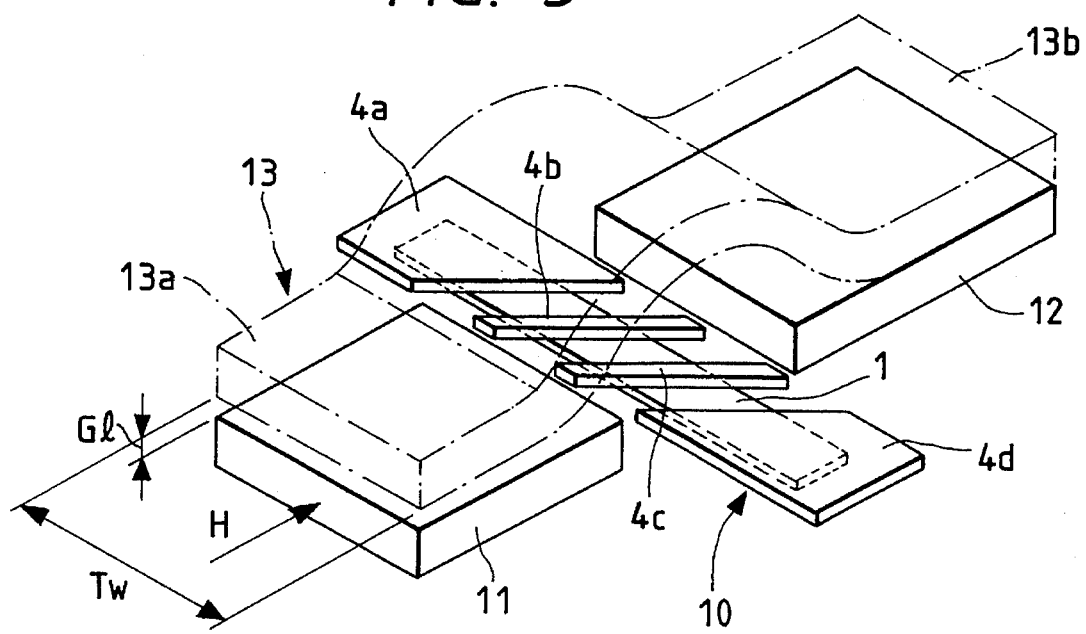
FIG. 3 is a perspective view showing an example of the way a magnetic sensor can be used.
Figure 4:
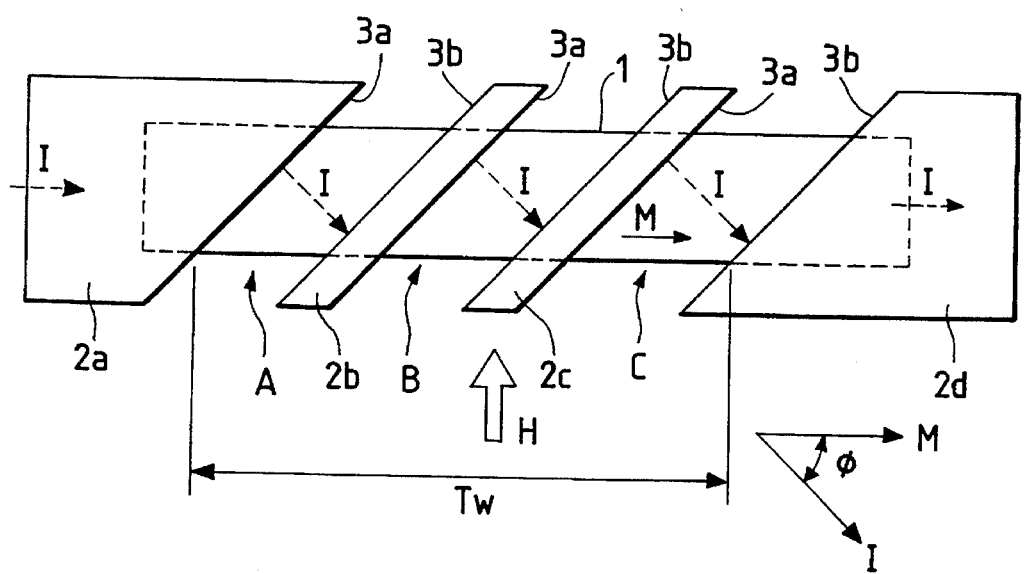
FIG. 4 is a plan view of a conventional magnetic sensor.

The magnetic sensor 10 shown in FIG. 1 or 2 is placed as it is so as to be opposed to a magnetic recording medium or the like and used such that an external magnetic field H, consisting of a leakage magnetic field, can directly act on the MR layer 1. However, it is also possible to adopt a structure in which, as shown in FIG. 3, the magnetic sensor 10 is placed between yoke layers 11 and 12, which are arranged close to it, and in which a yoke layer 13 is formed thereon, with one end 13a of the yoke layer 13 being opposed to the yoke layer 11 through the intermediation of a gap, and the other end 13b of the yoke layer 13 being magnetically in contact with the yoke layer 12. In this case, the width dimension of the yoke layer 11 is the track width Tw, and the gap between the yoke layer 11 and one end 13a of the yoke layer 13 is the magnetic gap length Gl.

This magnetic sensor 10 can be used for the reproduction of recording signals on a recording medium, such as a magnetic disk or a magnetic tape, or in other magnetic detecting devices.

The magnetic sensor of the present invention mainly comprises a double-layered structure composed of an MR layer and permanent magnet layers, so that it can be produced by a relatively simple film formation process.

Further, since the MR layer is turned into a single-magnetic domain by the permanent magnet layers, a reduction in Barkhausen noise can be achieved, thereby making it possible to perform magnetic detection with high accuracy.

Further, by making the electrical resistance of the permanent magnet layers higher than the electrical resistance of the MR layer, it is possible to cause an electric current to flow linearly. Further, by forming those permanent magnet layers which are at the ends of a conductive material, and making the electrical resistance of these permanent magnet layers higher than the electrical resistance of the MR layer, as described above, those permanent magnet layers can also serve as lead layers for supplying electric current to the MR layer.

What is claimed is:

1. A magnetic sensor comprising:
   a magnetoresistive effect layer to which an electric current is supplied; and
   a plurality of spaced-apart permanent magnet layers formed on said magnetoresistive layer such that a gap is formed between each adjacent pair of permanent magnet layers, said permanent magnetic layers being adapted to impart a bias magnetic field to said magnetoresistive layer, wherein said permanent magnet layers have slanted edges that are slanted with respect to a direction of said electric current and to a direction of an external magnetic field, with slanted edges of different polarities being opposed to each other across each gap.

2. A magnetic sensor according to claim 1, wherein an electrical resistance of said permanent magnet layers is greater than an electrical resistance of said magnetoresistive effect layer.

3. A magnetic sensor according to claim 2, wherein permanent magnet layers formed on end sections of said magnetoresistive effect layer also serve as lead layers through which said electric current is supplied to said magnetoresistive effect layer.

4. A magnetic sensor comprising:
   an elongated magnetoresistive effect layer having a length extending in a first direction and a width extending in a second direction, the second direction being perpendicular to the first direction; and
   a permanent magnet layer formed over said magnetoresistive layer and separated into a plurality of permanent magnet portions, each permanent magnet portion having an edge which is slanted with respect to the first and second directions;
   wherein one or more gaps are formed between the plurality of permanent magnet portions, each gap being located between opposing edges of an adjacent pair of permanent magnet portions, each gap being located over a corresponding section of the magnetoresistive layer; and
   wherein the plurality of permanent magnet portions are magnetized in a common direction such that the opposing edges of each adjacent pair of permanent magnet portions have opposite magnetic polarities.

5. A magnetic sensor according to claim 4, wherein an electrical resistance of said permanent magnet layer is greater than an electrical resistance of said magnetoresistive effect layer.

6. A magnetic sensor according to claim 5, wherein the elongated magnetoresistive effect layer includes a first end section and a second end section,
   wherein the plurality of permanent magnet portions include a first permanent magnet portion formed over the first end section and a second permanent magnet portion formed over the second end section, and
   wherein the first and second permanent magnet portions are electrically connected to the first and second end sections such that a voltage applied across the first and second permanent magnet portions generates a current through the elongated magnetoresistive effect layer in the first direction.

7. A magnetic sensor comprising:

an elongated magnetoresistive effect layer having a length extending in a first direction and a width extending in a second direction, the second direction being perpendicular to the first direction;

a first permanent magnet layer formed over the magnetoresistive effect layer and having a first edge which is slanted with respect to the first and second directions;

a second permanent magnet layer formed over the magnetoresistive effect layer and having a second edge which is slanted with respect to the first and second directions;

wherein the first and second edges are parallel and separated by a gap which is located over a section of the magnetoresistive layer; and wherein the first and second permanent magnet layers are magnetized in a common direction such that a magnetic polarity of the first edge is opposite to a magnetic polarity of the second edge.

8. A magnetic sensor according to claim 7, wherein an electrical resistance of said first and second permanent magnet layers is greater than an electrical resistance of said magnetoresistive effect layer.

9. A magnetic sensor according to claim 8, wherein the elongated magnetoresistive effect layer includes a first end section and a second end section, wherein the first permanent magnet layer is formed over the first end section and the second permanent magnet layer is formed over the second end section, and wherein the first and second permanent magnet layers are electrically connected to the first and second end sections such that a voltage applied across the first and second permanent magnet layers generates a current through the elongated magnetoresistive effect layer in the first direction.

* * * * *